US011735656B2

United States Patent
Rahman et al.

(10) Patent No.: US 11,735,656 B2
(45) Date of Patent: Aug. 22, 2023

(54) SOURCE CONTACT FORMATION OF MOSFET WITH GATE SHIELD BUFFER FOR PITCH REDUCTION

(71) Applicant: Silanna Asia Pte Ltd, Singapore (SG)

(72) Inventors: Touhidur Rahman, San Diego, CA (US); Shanghui Larry Tu, San Diego, CA (US)

(73) Assignee: Silanna Asia Pte Ltd, Singapore (SG)

( * ) Notice: Subject to any disclaimer, the term of this patent is extended or adjusted under 35 U.S.C. 154(b) by 242 days.

(21) Appl. No.: 17/015,592

(22) Filed: Sep. 9, 2020

(65) Prior Publication Data

US 2020/0411685 A1 Dec. 31, 2020

Related U.S. Application Data

(63) Continuation of application No. 16/103,780, filed on Aug. 14, 2018, now Pat. No. 10,790,389.

(51) Int. Cl.
| | |
|---|---|
| *H01L 29/78* | (2006.01) |
| *H01L 29/10* | (2006.01) |
| *H01L 29/417* | (2006.01) |
| *H01L 29/66* | (2006.01) |
| *H01L 29/40* | (2006.01) |
| *H01L 29/06* | (2006.01) |

(52) U.S. Cl.
CPC ...... *H01L 29/7824* (2013.01); *H01L 29/0696* (2013.01); *H01L 29/1095* (2013.01);
(Continued)

(58) Field of Classification Search
CPC .......... H01L 29/66681; H01L 29/7816; H01L 29/7824; H01L 29/78639; H01L 29/41733;
(Continued)

(56) References Cited

U.S. PATENT DOCUMENTS 6,107,160 A * 8/2000 Hebert ................. H01L 27/088
257/E27.06
6,222,229 B1 4/2001 Hebert et al.
(Continued)

FOREIGN PATENT DOCUMENTS

TW 200807719 A 2/2008
TW 201423949 A 6/2014
(Continued)

OTHER PUBLICATIONS

Notice of Allowance dated Jun. 4, 2020 for U.S. Appl. No. 16/103,780.
(Continued)

*Primary Examiner* — Julio J Maldonado
*Assistant Examiner* — Stanetta D Isaac
(74) *Attorney, Agent, or Firm* — MLO, a professional corp.

(57) ABSTRACT

A semiconductor structure that includes at least one lateral diffusion field effect transistor is described. The structure includes a source contact and a gate shield that enables the line width of an ohmic region that electrically connects the source/body region to the gate shield to be smaller than the minimum contact feature size. The gate shield defines a bottom recess for forming a narrower bottom portion of the source contact, and a section that flares outward with distance from the ohmic region to extend above and laterally beyond the ohmic region. By providing a wider area for the source contact, the flared portion of the gate shield allows the portion of the gate shield that contacts the ohmic region to be narrower than the minimum contact feature size. As a result, the cell pitch of the lateral diffusion field effect transistor can be reduced.

15 Claims, 4 Drawing Sheets

(52) U.S. Cl.
CPC ........ *H01L 29/402* (2013.01); *H01L 29/4175* (2013.01); *H01L 29/41775* (2013.01); *H01L 29/66696* (2013.01)

(58) Field of Classification Search
CPC ........... H01L 29/78624; H01L 29/0878; H01L 29/0692; H01L 29/1083; H01L 29/665; H01L 29/41766
See application file for complete search history.

(56) References Cited

U.S. PATENT DOCUMENTS

| | | |
|---|---|---|
| 7,851,286 B2 | 12/2010 | Hébert |
| 9,716,166 B2 | 7/2017 | Zhang et al. |
| 2005/0280080 A1* | 12/2005 | Babcock ............... H01L 29/402 |
| | | 257/E29.054 |
| 2006/0261408 A1 | 11/2006 | Khemka et al. |
| 2008/0042236 A1 | 2/2008 | Leng |
| 2016/0218196 A1 | 7/2016 | Zhang et al. |

FOREIGN PATENT DOCUMENTS

| | | |
|---|---|---|
| TW | 201725698 A | 7/2017 |
| TW | 201743408 A | 12/2017 |

OTHER PUBLICATIONS

Office Action dated Feb. 24, 2020 for U.S. Appl. No. 16/103,780.
Office Action dated Feb. 3, 2023 for Taiwan, Province of China Patent Application No. 108127935.

* cited by examiner

SOURCE CONTACT FORMATION OF MOSFET WITH GATE SHIELD BUFFER FOR PITCH REDUCTION

RELATED APPLICATIONS

This application is a continuation of U.S. patent application Ser. No. 16/103,780 filed Aug. 14, 2018, which is hereby incorporated by reference for all purposes.

BACKGROUND

Semiconductor power devices are specialized devices used as switches or rectifiers in power electronics circuits. Semiconductor power devices are characterized by their ability to withstand high voltages and large currents as well as the high temperatures associated with high power operation. For example, a switching voltage regulator typically includes two power devices that repeatedly switch on and off in a synchronized manner to regulate a voltage. The power devices in this situation need to sink system-level current in the on state, withstand the full potential of the power supply in the off state, and dissipate a large amount of heat. The ideal power device is able to operate in high power conditions, can rapidly switch between on and off states, and exhibits low thermal and on-state resistance.

FIG. 1 shows an example of a high power semiconductor switch circuit 10 that includes a high-side field effect transistor (FET) 12 and a low-side FET 14. The source of the high-side FET 12 is coupled to the drain of the low-side FET 14 at a switch node 16. The driver input terminals 18, 20 control the duty cycles of the high-side FET 12 and the low-side FET 14 to convert the input voltage (VIN) at the input node 22 to a particular output voltage ($V_{PHASE}$) at the switch node 16. In general, the FETs 12, 14 may be fabricated using any of a wide variety of semiconductor material systems and technologies, including silicon, germanium, and compound semiconductor technologies.

A transistor structure referred to as a lateral diffusion field effect transistor (LDFET) can be used to implement a power device. In some examples, the LDFET may be a lateral diffusion metal oxide semiconductor field effect transistor (LDMOSFET). The "lateral diffusion" portion of this term refers to an extension of the drain region that is less strongly doped than the drain contact region and that extends laterally away from the channel. This region is often referred to as the low-doped or lightly-doped drain (LDD) region. The LDD region allows the transistor to switch high voltages by making it able to withstand greater voltages in the off-state by absorbing portions of the electric field that would otherwise cause the transistor breakdown due to one of several phenomenon, such as source-drain punch through, onset of avalanche breakdown, gate oxide rupture, etc.

A LDFET can include a gate shield that covers at least a portion of the LDD region and the gate electrode. The gate shield improves the shape of electric field in the LDD region and thus increases the voltage blocking capability in the off-state. Additionally, the gate shield lowers the gate-to-drain capacitance of the LDFET structure. In addition, the gate shield allows for a higher doping of the LDD by completely or partially removing localized high electric field due to voltage signals applied to the drain contact of the device. As a result, the on-state resistance of the power device can decrease while preserving the device's high breakdown.

FIG. 2 shows an example of a RF LDFET or Power FET integrated circuit system 30 that is described in U.S. Patent Application Publication No. 20080042236. The integrated circuit system 30 is bounded by isolation regions 41, 43 and includes a gate 37 over a gate oxide layer 39, where the gate includes a polysilicon bottom layer and a tungsten silicide top layer. The integrated circuit system 30 also includes a gate shield 32, a shield interconnect 34, a source bar 36, and a drain 47. These features are formed as an integral structure in a single masking step by etching the features in a interlayer dielectric 40, depositing a barrier layer 38 (e.g., a titanium/titanium nitride layer) over the features, and filling the remaining etched space 32, 34, 36 with a low resistivity metal (e.g., tungsten). The barrier layer 38 helps to form reliable ohmic contacts to shallow junctions without material diffusion problems. A silicide ohmic contact 42 electrically connects the barrier layer 38 to the body/source regions 44, 46. In accordance with the disclosure in U.S. Patent Application Publication No. 20080042236, by this process, the shield line width and the shield interconnect line width can be kept close to the minimum feature size of the contact mask (see ¶30).

SUMMARY

In accordance with an embodiment, a semiconductor structure includes a lateral diffusion field effect transistor (LDFET). The LDFET includes a source contact that has an upper portion and a narrower bottom portion that extend vertically through a first interlayer dielectric with the narrower bottom portion electrically connected to a source region formed in an active region of the transistor and has a first conductivity type. A first drain region is formed in the active region and has the first conductivity type. A second drain region of the first conductivity type is spaced laterally from the first drain region in the active region, and electrically connects a drain contact and the first drain region. A channel region of the second conductivity type is in the active region between the source region and the first drain region and connected to the source contact through the body of second conductivity. A gate electrode is located above the channel region and is separated from the channel region by a gate dielectric. A shield plate extends laterally over at least a portion of the first drain region and the gate electrode to the source contact, and further extends along a side of the narrower bottom portion of the source contact and between the source contact and the source region. The shield plate is separated from the first drain region and the gate electrode by a second interlayer dielectric.

In an example, the source contact includes a tapered section between the upper portion of the source contact and the narrower bottom portion of the source contact. The tapered section is characterized by a lateral width that decreases monotonically from a top portion of the tapered section to a bottom portion of the tapered section. The upper portion of the source contact includes a first substantially uniform lateral width along a substantial portion of its vertical extent. The bottom portion of the source contact includes a second substantially uniform lateral width along a substantial portion of its vertical extent, where the lateral width of the upper portion of the source contact is larger than the lateral width of the bottom portion of the source contact. In an example, half the first substantially uniform lateral width is larger than half the second substantially uniform lateral width by an amount that is at least as large as a thickness of the shield plate on a side of the bottom portion of the source contact. In an example, the shield plate extends from a position above the first drain region to a position on a top portion of the tapered section, and extends downward along the tapered section and the narrower bottom portion of the source contact, and between a bottom surface of the source contact and the source region.

In an example, an ohmic region is between the shield plate and the source region of the first conductivity type and a body region of the second conductivity type, where the ohmic region electrically connects the shield plate to the source region and the body region. In an example, the ohmic region is on the active region, and the shield plate comprises a surface that contacts the ohmic region. In an example, the ohmic region is in the active region, and the shield plate includes a surface that contacts the ohmic region. In an example, the ohmic region electrically connects the shield plate to the body region.

In an example, the shield plate electrically connects the source contact to the source region. In an example, the shield plate includes Ti—TiN. In an example, the source contact is metallic. In an example, the first drain region is doped with a lower dopant concentration than the source region, and the second drain region is doped with a higher dopant concentration than the first drain region.

In some examples, multiple pairs of source and body regions are arranged in the active region orthogonally with respect to a length dimension of the gate electrode. In some examples, multiple pairs of source and body regions alternately arranged in the active region in parallel with respect to a length dimension of the gate electrode.

In accordance with an embodiment, a method of forming a semiconductor structure that includes at least one lateral diffusion field effect transistor (LDFET). In accordance with this method, an active region having a second conductivity type is formed on a substrate. A source region having the first conductivity type is formed in the active region proximate an upper surface of the active region. A first drain region having the first conductivity type is formed in the active region proximate the upper surface of the active region and spaced laterally from the source region. A body region having the second conductivity type is formed in the active region between the source region and the drain region. A second drain region having the first conductivity type is formed in the active region surrounded by the first drain region. A gate electrode is formed above the active region proximate the upper surface of the active region and at least partially overlapping both the source region and the first drain region. A source contact is formed that includes an upper portion and a narrower bottom portion that extend vertically through a first interlayer dielectric with the narrower bottom portion electrically connected to the source region. A shielding structure is formed that extends laterally over at least a portion of the first drain region and the gate electrode to the source contact, and further extends along a side of the narrower bottom portion of the source contact and between the source contact and the source region, where the shielding structure is separated from the first drain region and the gate electrode by a second interlayer dielectric.

Embodiments of the disclosed semiconductor structure provide additional or other advantages to those mentioned above. One skilled in the art will readily appreciate these advantages from the following detailed description together with the following drawings.

DETAILED DESCRIPTION

Figure 1:
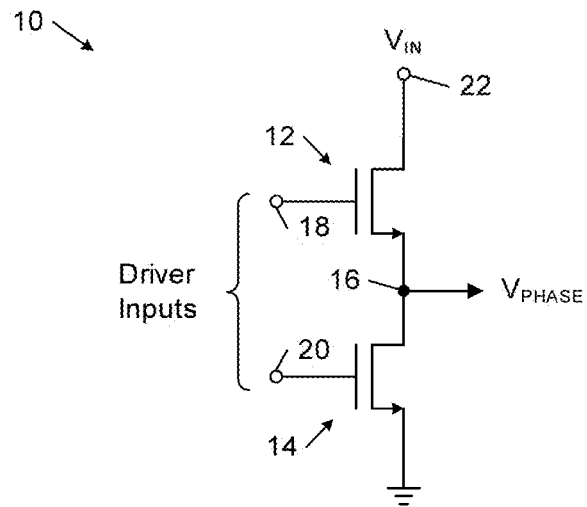
FIG. 1 is a circuit diagram of an example of a power switch circuit structure.
Figure 2:
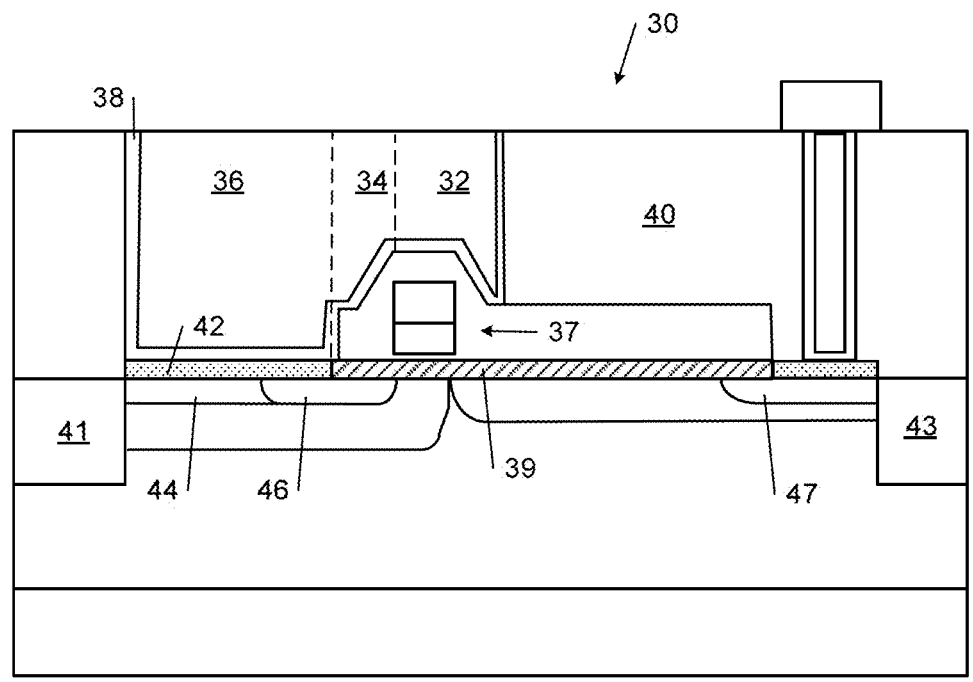
FIG. 2 is a diagrammatic cross-sectional view of at least a portion of an example LDFET.

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the scope thereof. For instance, features illustrated or described as part of one embodiment may be used with another embodiment to yield a still further embodiment. Thus, it is intended that the present subject matter covers all such modifications and variations within the scope of the appended claims and their equivalents.

The terms "lateral" and "horizontal" refer to a direction or a plane parallel to the plane or surface of a substrate without regard to orientation. The term "vertical" refers to a direction perpendicular to the horizontal. Terms, such as "on", "above", "bottom", "top", "side", "upper", and "over", are defined with respect to the horizontal plane. The term "monotonically decreasing" refers to always decreasing or remaining constant, and not increasing.

The lightly doped drain (LDD) region of a lateral diffusion field effect transistor (LDFET) provides the device with an increased breakdown voltage at the expense of increasing the on-resistance of the transistor. Increasing the breakdown voltage of the transistor can be achieved by decreasing the doping level of the LDD or by extending the lateral expanse of the LDD. Both of these approaches, however, increase the on-resistance of the LDFET either by reducing the conductivity of the LDD or increasing the length of the LDD region, which is directly proportional to the impedance of the region in the direction of current flow. This interrelationship presents a difficult design problem because the on-state resistance of a power device must be kept low or the device will burn a significant amount of power when it sinks the large currents that power devices are meant to handle.

The present disclosure describes a semiconductor structure that includes at least one lateral diffusion field effect transistor with a source contact and a gate shield (also referred to as a "shield plate") structure that enables the line width of an ohmic region that electrically connects the source/body region to the gate shield to be smaller than the minimum contact feature size for a given fabrication process. In particular, the gate shield structure defines a bottom recess above the ohmic region that is narrower than the minimum contact feature size, and a flared section that flares outward with distance from the ohmic region to extend above and beyond the ohmic region. Equivalently, the flared section may be characterized as a tapered section that has a lateral width that decreases from a top portion of the tapered section to a bottom portion of the tapered section. In some examples, the flared/tapered section monotonically flares outward with increasing distance from the ohmic region and monotonically tapers inward with decreasing distance from the ohmic region. By providing a wider area for the formation of the source contact, the flared gate shield section allows the width of the gate shield that contacts the ohmic region to be narrower than the minimum contact feature size. As a result, the cell pitch of the lateral diffusion field effect transistor can be reduced.

Figures 3, 4:
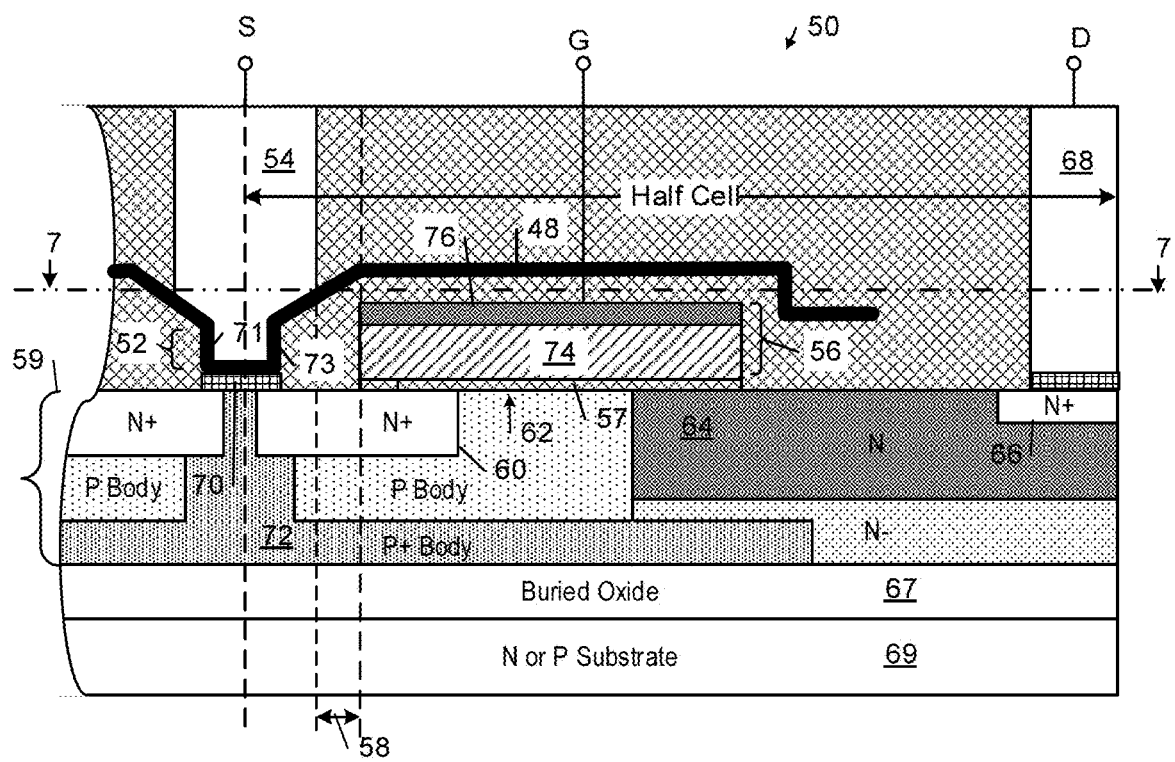
FIG. 3 is a diagrammatic cross-sectional view of at least a portion of an example n-channel LDFET.
FIG. 4 is a diagrammatic cross-sectional view of at least a portion of an example p-channel LDFET.

FIG. 3 shows an example n-channel LDFET 50 according to an embodiment. The LDFET 50 exhibits a narrower cell pitch as a result of having a gate shield 48 that defines a support structure for forming a bottom portion 52 of the source contact 54 that is narrower than the minimum contact feature size. In particular, a configuration in which the bottom portion 52 of the source contact 54 is narrower than the minimum contact feature size allows the gate 56 to be laterally positioned closer to the source contact 54 (e.g., as measured along the lateral dimension 58) without violating the contact spacing requirements specified for the fabrication process. This allows the cell pitch to be shortened. In some examples, the width of the ohmic region 70 is at least as wide as the lateral dimension corresponding to the combined width of the bottom portion of the source contact 54 and the widths of the vertical extensions 71, 73 of the gate shield 48 from the bottom of the gate shield on the ohmic region 70.

The LDFET 50 includes an active region 59. The active region 59 includes a source region 60, a channel region 62, a lightly doped drain region 64, and a drain region 66. The source region 60, the lightly doped drain region 64, and the drain region 66 can include doped semiconductor material formed by, for example, the implant of impurities into the active region 59. The doped semiconductor material of each of the source region 60, the lightly doped drain (LDD) region 64, and the drain region 66 has a similar conductivity type (e.g., n-type), which is the opposite conductivity type of the channel 62 (e.g., p-type). Each region 60, 64, and 66 can be formed with the same dopant species by implanting the same kind of dopant in the respective region. The lightly doped drain (LDD) region 64 has a lower dopant concentration than the source region 60. The lightly doped drain (LDD) region 64 improves the performance of the LDFET 50 by blocking large voltages and sinking large currents without degrading. Source region 60 is electrically coupled to a source contact 54 through the ohmic region 70 and the gate shield 48. The drain region 66 is electrically coupled to the drain contact 68. The drain region 66 can be a highly doped drain region and can form an electrically conductive path between the drain contact 68 and the lightly doped drain (LDD) region 64.

The LDFET 50 also includes a gate 56 overlying a gate oxide layer 57 on the active region 59. In the illustrated example, the gate 56 includes a bottom electrically conductive layer 74 (e.g., polysilicon) and a metal silicide (e.g., cobalt or tungsten silicide) top layer 76.

The source contact 54 and drain contact 68 provide electrical connections to the LDFET 50 from other circuitry that may or may not be integrated with the LDFET 50 on the same integrated circuit. In the illustrated example, the source region 60 and the body region 72 are electrically coupled to the source contact 54 through the gate shield 48 by a silicide layer 70 that is formed on the surface of the source region 60 and a body region 72. In general, the source region 60 and the body region 72 can be electrically coupled to the source contact 54 using any process that forms an ohmic or non-rectifying contact with the two regions of the structure. The connection between the drain contact 68 and the drain region 66 can include any of the variations described above in connection with the source contact 54 and the source region 60. The source contact 54 and the drain contact 68 can include a metal, metal alloy, metal silicide, or an electrically conductive semiconductor material such as doped polysilicon. Exemplary metals, metal alloys, and metal silicides can each include copper, tungsten, molybdenum, and aluminum.

In various embodiments, the active region 59 can be a doped portion of the bulk of a semiconductor wafer, a localized well formed in a larger doped portion of a semiconductor wafer, the active region of a semiconductor-on-insulator (SOI) wafer, or a localized well formed in an SOI wafer. In the illustrated example, the active region 59 is a thin film formed over a buried insulator 67 of a SOI substrate 69 (e.g., a p-type or n-type substrate).

In an example operation of the LDFET 50, a conduction current flows from the source contact 54 to the source region 60, through the channel region 62, the lightly doped drain region 64, and the drain region 66, and into the drain contact 68. In this process, the source contact 54 may be tied to ground potential and the drain 68 may be biased at a positive voltage level. The LDFET 50 operates as a switch by presenting a variably electrically conductive path between the drain contact 68 and the source contact 54 through the channel 62, which has a first conductivity type (e.g., p-type) and separates the source region 60 and the LDD region 64, each of which has a second conductivity type (e.g., n-type). The voltage applied to the gate 56 controls the polarity of free carriers in the channel 62. When the free charge in the channel 62 is of the same conductivity type as the source and the LDD regions 60, 64 current will flow in the channel 62, where the magnitude of the gate voltage controls the magnitude of the free charge current of the same conductivity type as the source and the LDD regions 60, 64.

The gate shield 48 is located above the gate electrode 56 and the LDD region 64. The gate shield 48 is electrically coupled to the source region 60 and the body region 72 by a silicide layer 70 (e.g., a metal silicide layer, such as tungsten silicide, titanium silicide, and cobalt silicide) that forms an ohmic contact between the gate shield 48 and the source and body regions 60, 72. In some examples, during or after the gate 56 has been formed, a first dielectric layer (e.g., silicon nitride or an interlayer dielectric) is deposited on the gate 56 and patterned (e.g., by etching) to create a via for depositing the silicide layer for the ohmic contact 70 and create a surface corresponding to the desired shape of the gate shield 48. The gate shield 48 is formed by depositing an electrically conductive material (e.g., Ti—TiN) on the patterned dielectric layer and etching the deposited material to create the gate shield 48. A second dielectric layer (e.g., an interlayer dielectric layer) is deposited on the gate shield 48. A source contact via is etched into the second dielectric layer to the gate shield and filled with an electrically conductive plug (e.g., a metal, such as Ti/TiN/W) to form the source contact 54. A drain contact via is etched into the second dielectric layer to the drain region 66 and filled with an electrically conductive material (e.g., a metal plug, such as Ti/TiN/W).

FIG. 4 shows an example LDFET 80 according to another embodiment that corresponds to a p-channel version of the LDFET 50 described above in connection with FIG. 3. The LDFET 80 exhibits a narrower cell pitch as a result of having a gate shield 82 that defines a support structure for forming a bottom portion 84 of the source 86 that is narrower than the minimum contact feature size.

Figure 5:
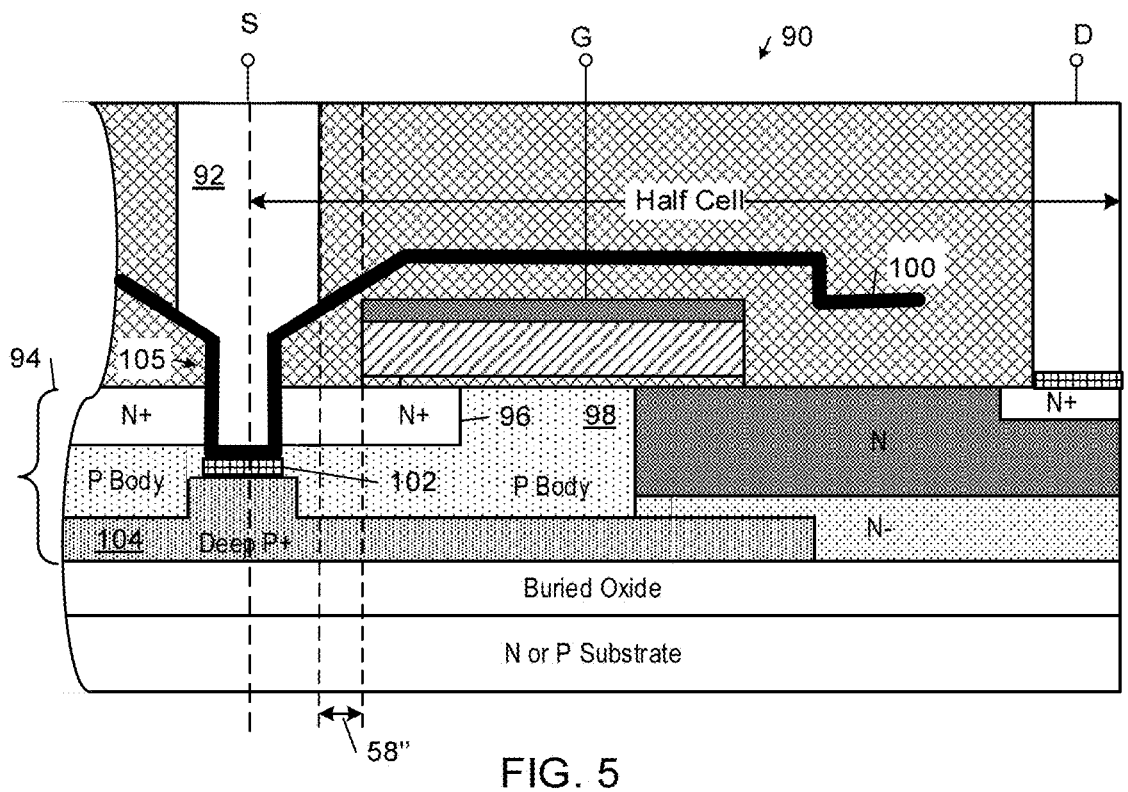
FIG. 5 is a diagrammatic cross-sectional view of at least a portion of an example n-channel LDFET.

FIG. 5 shows an example LDFET 90 according to another embodiment that corresponds to the LDFET 50 described above except that, instead of contacting the source and body regions 60, 72 with an ohmic region 70 at the top surface of the active region 59, as shown in FIG. 3, the source contact 92 extends vertically into the active region 94 to contact the source and body regions 96, 98, 104. In the illustrated example, the source contact 92 is electrically connected to the deep P+ region 104 through the gate shield 100 and metal silicide ohmic region 102. The LDFET 90 exhibits a narrower cell pitch as a result of having a gate shield 100 that defines a support structure for forming a bottom portion 105 of the source contact 92 above the active region 94 that is narrower than the minimum contact feature size.

In some embodiments, the deep P+ region 104 of the LDFET 90 shown in FIG. 5 extends upward to surround the sides of the silicide region 102 and partially into the N+ regions (e.g., region 96) adjacent the bottom portion of the shield plate 100 surrounding the narrowed bottom portion 105 of the source contact 92.

Figure 6:
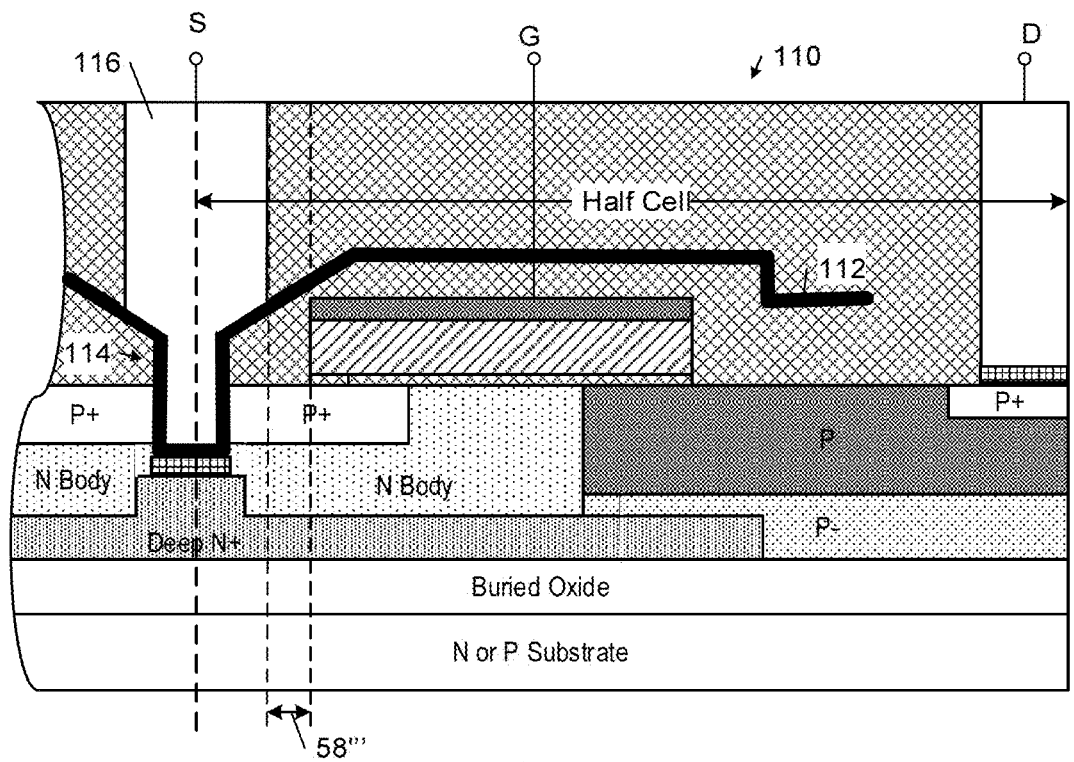
FIG. 6 is a diagrammatic cross-sectional view of at least a portion of an example p-channel LDFET.

FIG. 6 shows an example LDFET 110 according to another embodiment that corresponds to a p-channel version of the LDFET 90 described above in connection with FIG. 5. The LDFET 110 exhibits a narrower cell pitch as a result of having a gate shield 112 that defines a support structure for forming a bottom portion 114 of the source contact 116 that is narrower than the minimum contact feature size. In some embodiments, the deep N+ region 104 of the LDFET 110 shown in FIG. 6 extends upward to surround the sides of the silicide region and partially into the overlying P+ regions adjacent the bottom portion of the shield plate 112 surrounding the narrowed bottom portion 114 of the source contact 116.

Figure 7:
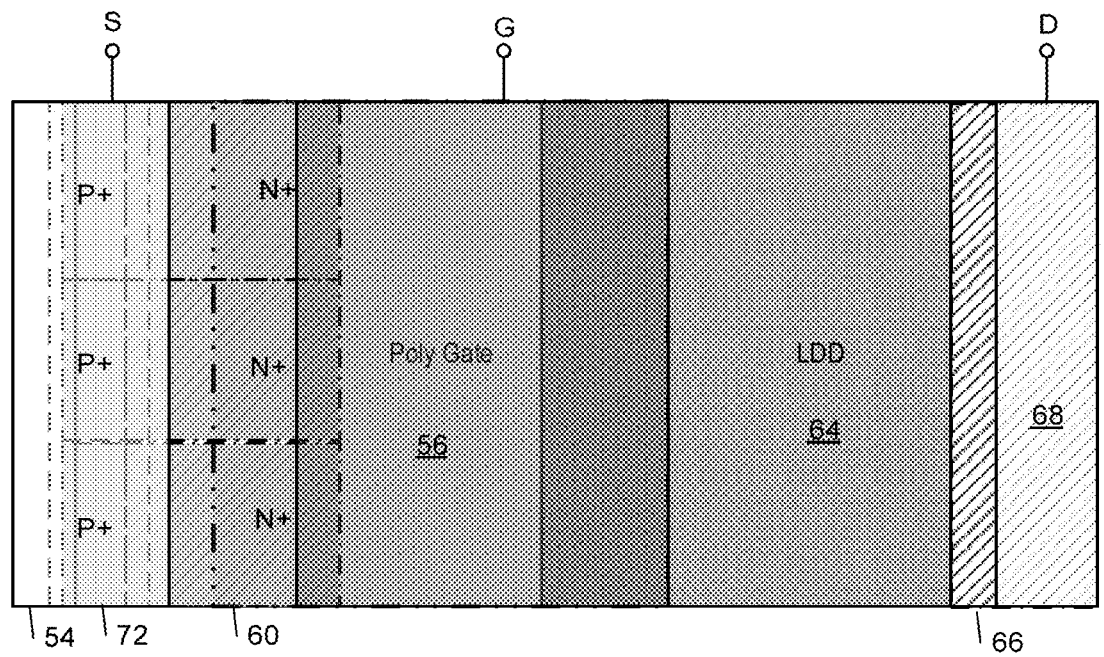
FIG. 7 is a top semitransparent projection view of the example n-channel LDFET half cell shown in FIG. 3.

FIG. 7 shows an example top semitransparent projection view of the LDFET 50 half cell shown in FIG. 3 taken along the line 7-7 in which multiple pairs of n-type source 60 and p-type body regions 72 are arranged orthogonally with respect to the length of the gate electrode 56, which extends into the plane of the drawing shown in FIG. 3.

Figure 8:
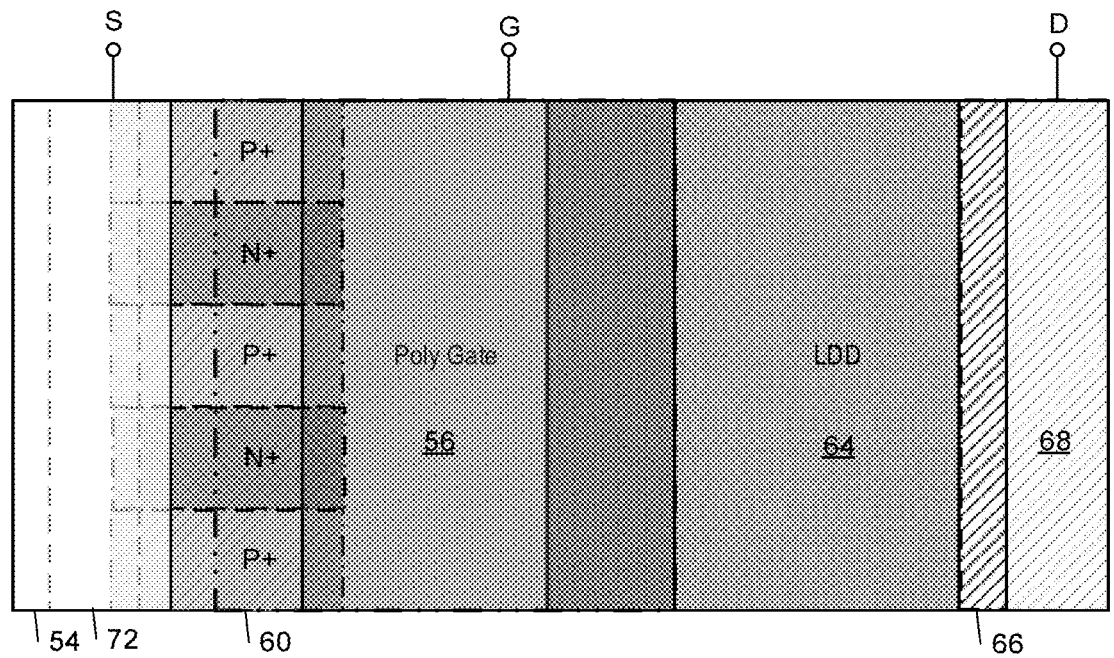
FIG. 8 is a top semitransparent projection view of an example n-channel LDFET half cell.

FIG. 8 shows an example top semitransparent projection view of the LDFET 50 half cell shown in FIG. 3 taken along the line 7-7 in which multiple pairs of n-type source 60 and p-type body regions 72 are alternately arranged in parallel with respect to the length of the gate electrode 56, which extends into the plane of the drawing shown in FIG. 3.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

The invention claimed is:

1. A semiconductor structure comprising at least one lateral diffusion field effect transistor, comprising:
    a source contact comprising an upper portion and a narrower bottom portion that extend vertically through a first interlayer dielectric with the narrower bottom portion electrically connected to a source region formed in an active region of the transistor and having a first conductivity type;
    a first drain region formed in the active region and having the first conductivity type;
    a second drain region of the first conductivity type spaced laterally from the first drain region in the active region, and electrically connecting a drain contact and the first drain region;
    a channel region of a second conductivity type in the active region between the source region and the first drain region;
    a gate electrode located above the channel region and separated from the channel region by a gate dielectric; and
    a shield plate extending laterally over at least a portion of the first drain region and the gate electrode to the source contact, further extending along a side of the narrower bottom portion of the source contact and between the source contact and the source region, and not extending laterally underneath the gate electrode, wherein the shield plate is separated from the first drain region and the gate electrode by a second interlayer dielectric, the source contact being in physical contact with a top surface of a section of the shield plate, a bottom surface of the section of the shield plate being separated from the source region by a third interlayer dielectric;
    and wherein:
    the source contact comprises a tapered section between the upper portion of the source contact and the narrower bottom portion of the source contact; and
    the shield plate extends from a position above the first drain region to a position contacting a top portion of the tapered section of the source contact, and extends downward along the tapered section of the source contact and the narrower bottom portion of the source contact, and between a bottom surface of the source contact and the source region.

2. The semiconductor structure of claim 1, wherein the tapered section of the source contact is characterized by a lateral width that decreases monotonically from a top portion of the tapered section of the source contact to a bottom portion of the tapered section of the source contact.

3. The semiconductor structure of claim 2, wherein the upper portion of the source contact comprises a first substantially uniform lateral width along a substantial portion of a vertical extent of the upper portion of the source contact.

4. The semiconductor structure of claim 3, wherein the bottom portion of the source contact comprises a second substantially uniform lateral width along a substantial portion of a vertical extent of the bottom portion of the source contact, wherein the lateral width of the upper portion of the source contact is larger than the lateral width of the bottom portion of the source contact.

5. The semiconductor structure of claim 4, wherein half the first substantially uniform lateral width is larger than half the second substantially uniform lateral width by an amount that is at least as large as a width of a vertical extension of the shield plate from a bottom of the shield plate on a side of the narrower bottom portion of the source contact.

6. The semiconductor structure of claim 1, further comprising an ohmic region between the shield plate and at least one of the source region of the first conductivity type and a body region of the second conductivity type, wherein the ohmic region electrically connects the shield plate to at least one of the source region and the body region.

7. The semiconductor structure of claim 6, wherein the ohmic region is on the active region, and the shield plate comprises a surface that contacts the ohmic region.

8. The semiconductor structure of claim 6, wherein the ohmic region is in the active region, and the shield plate comprises a surface that contacts the ohmic region.

9. The semiconductor structure of claim 6, wherein the ohmic region electrically connects the shield plate to the body region.

10. The semiconductor structure of claim 9, wherein the shield plate electrically connects the source contact to the source region.

11. The semiconductor structure of claim 9, wherein the shield plate comprises Ti—TiN.

12. The semiconductor structure of claim 1, wherein the source contact is metallic.

13. The semiconductor structure of claim 1, wherein the first drain region is doped with a lower dopant concentration than the source region, and the second drain region is doped with a higher dopant concentration than the first drain region.

14. The semiconductor structure of claim 1, comprising multiple pairs of source and body regions arranged orthogonally with respect to a length dimension of the gate electrode.

15. The semiconductor structure of claim 1, comprising multiple pairs of source and body regions alternately arranged in parallel with respect to a length dimension of the gate electrode.

* * * * *